United States Patent
Fritz

(10) Patent No.: US 7,474,087 B2
(45) Date of Patent: Jan. 6, 2009

(54) ENERGY METER SYSTEM AND METHOD FOR CALIBRATION

(75) Inventor: Gerhard Fritz, Graz (AT)

(73) Assignee: Austriamicrosystems AG, Unterpremstatten (AT)

(*) Notice: Subject to any disclaimer, the term of this patent is extended or adjusted under 35 U.S.C. 154(b) by 0 days.

(21) Appl. No.: 10/591,031

(22) PCT Filed: Mar. 3, 2005

(86) PCT No.: PCT/EP2005/002264

§ 371 (c)(1),
(2), (4) Date: Mar. 1, 2007

(87) PCT Pub. No.: WO2005/085881

PCT Pub. Date: Sep. 15, 2005

(65) Prior Publication Data

US 2007/0200552 A1    Aug. 30, 2007

(30) Foreign Application Priority Data

Mar. 4, 2004    (DE)    ........................ 10 2004 010 707

(51) Int. Cl.
G01R 7/00    (2006.01)
(52) U.S. Cl. ........................... 324/142; 324/107; 702/61
(58) Field of Classification Search ................... None
See application file for complete search history.

(56) References Cited

U.S. PATENT DOCUMENTS

| 4,408,283 | A | | 10/1983 | Kovalchik et al. |
| 4,884,021 | A | * | 11/1989 | Hammond et al. .......... 324/142 |
| 5,017,860 | A | | 5/1991 | Germer et al. |
| 5,545,981 | A | | 8/1996 | Dubin et al. |
| 5,657,237 | A | | 8/1997 | Mazzoni |
| 6,239,589 | B1 | | 5/2001 | Windsheimer |
| 6,373,415 | B1 | | 4/2002 | King et al. |
| 6,377,037 | B1 | | 4/2002 | Burns et al. |
| 6,417,792 | B1 | | 7/2002 | King et al. |
| 6,555,997 | B1 | | 4/2003 | De Vries et al. |

(Continued)

FOREIGN PATENT DOCUMENTS

DE    26 30 959    1/1978

(Continued)

OTHER PUBLICATIONS

English translation of International Preliminary Examination Report for PCT/EP2005/002264.

(Continued)

*Primary Examiner*—Minh N Tang
(74) *Attorney, Agent, or Firm*—Fish & Richardson P.C.

(57) ABSTRACT

An energy meter device includes a first analog/digital transformer having an input configured to provide a signal derived from a voltage and a second analog/digital transformer having an input configured to provide a signal derived from a current. A first input of the phase evaluation block is electrically connected to the output of the first analog/digital transformer and a second input of the phase evaluation block is electrically connected to the output of the second analog/digital transformer. The energy meter device also includes a phase correction block electrically connected to the output of the phase evaluation block and configured to correct a phase deviation of a digitized signal that is derived from the current or the voltage.

22 Claims, 1 Drawing Sheet

U.S. PATENT DOCUMENTS

| | | |
|---|---|---|
| 2003/0042886 A1 | 3/2003 | Gandhi |
| 2007/0200552 A1 | 8/2007 | Fritz |
| 2007/0279041 A1 | 12/2007 | Fritz et al. |

FOREIGN PATENT DOCUMENTS

| | | |
|---|---|---|
| DE | 27 08 075 | 8/1978 |
| DE | 35 14 371 | 10/1986 |
| DE | 689 20 984 | 7/1995 |
| DE | 692 28 850 | 10/1999 |
| DE | 198 42 241 | 4/2000 |
| DE | 692 21 939 | 4/2002 |
| DE | 101 62 259 | 7/2003 |
| EP | 0 634 662 | 1/1995 |
| EP | 0 534 583 | 4/1999 |
| GB | 1 563 677 | 3/1980 |
| GB | 1 575 148 | 9/1980 |
| GB | 2 319 345 | 5/1998 |
| JP | 59-042460 | 3/1984 |
| JP | 62-162917 | 7/1987 |
| WO | WO 2005/066643 | 7/2005 |

OTHER PUBLICATIONS

Nagura, H. et al. "Correction Method for a Single Chip Power Meter" IMTC, May 10-12, 1994, pp. 1313-1316, XP 01021767, ISBN 0-7803-1880-3.

English Translation of the International Preliminary Report on Patentability in Application No. PCT/EP2004/012879, dated Dec. 28, 2006.

* cited by examiner

ENERGY METER SYSTEM AND METHOD FOR CALIBRATION

The patent application describes an energy meter device and a method for the calibration of the energy meter device.

BACKGROUND

Energy meters are used to record consumed or produced electrical energy. Such energy meters are also designated as current meters or kilowatt hour meters.

Normally speaking, tension and electricity are recorded, digitized and multiplied with one another in energy meters that are electronically operated. The current electrical power is ready following this multiplication. When this electrical power is integrated or accumulated over time, a signal is obtained which constitutes a measurement for the electrical energy that was generated or produced in a certain time interval.

Voltage dividers, voltage transformers or other means can be applied for signal extraction in order to obtain proportional signals for electrical voltage and electrical current.

It is for many applications essential that a galvanic isolation is to be provided in at least one of both chancels to record voltage and current. Such a galvanic isolation of the electric circuit prepares for instance a transformer.

However, the phase shift, which is caused by the inductive coupling of the transformer, is problematic in such transformers. On the one hand, the phase shift shows between the output signal and the input signal. On the other hand, the phase shift is also detected between the current and signal that represents the voltage. However, undesired measurement errors are caused as a result thereof when multiplying tension and current. It must hereby be observed that tension and current mostly do not exist as equal signals but rather as alternating current signals with a more or less harmonic signal form.

The described problems are additionally intensified by the fact that a non-exact predictable phase shift between both input channels can be caused by manufacturing tolerances, temperature effects, alteration effects or other unavoidable effects of a mass manufacturing even when a transformer-like transmitter is each time used in a voltage and current channel.

RC-networks, which comprise resistors and condensers, can for instance be used to correct the described undesired phase shift. However, these must usually be designed as additional external components and can normally not be integrated with disadvantages. Furthermore, the problems of the tolerances conditioned by the manufacturing and temperature are not fundamentally solved because of that.

SUMMARY

An energy meter device that can be integrated with a low expenditure, as well as a method for the calibration thereof, in such a way that the voltage and/or the current with galvanic isolation can be recorded without the occurrence of measurement errors is described.

The task with regard to the device is solved by an energy meter device featuring:
- an initial input for the feeding of signal that is derived from a voltage, whereto an initial analog/digital transformer is attached, which has an output,
- a second input for the feeding of a signal that is derived from a current, whereto a second analog/digital transformer is attached, which has an output,
- a multiplier which links the outputs of both analog/digital transformers with one another,
- a phase evaluation block with two inputs, which are connected with the outputs of both analog/digital transformers, and with one output that is connected with a control input of a phase correction block, and
- the phase correction block, which is connected an output of one of both analog/digital transformers, designed to correct a phase deviation of the digitized signal that is derived from a current or voltage.

According to the proposed principle, a phase shift between the input of the energy meter device, whereto a signal derived from an electrical voltage is fed, and the input of the energy meter device, whereto a signal derived from an electrical current is fed, is recorded and compensated. The signal inputs to feed the signal that is derived from the voltage and the current can also be designated as input channels, namely voltage channel and current channel.

The phase evaluation and correction is thereby entirely and advantageously implemented in the digital signal processing.

The proposed measurement and compensation of the phase shift between both channels makes it possible to galvanically and advantageously isolate the channels from one another and/or at least one input from the energy meter device. Measurement errors of the device are avoided through the calibration of the phase shift. No external compensation networks, such as resistance capacity networks are necessary for the phase shift.

The phase evaluation block as well as the phase correction block advantageously effect a so-called on-chip phase correction of the energy meter device without any external components.

The phase deviation between both input channels can for instance be measured in a calibration mode by the fact that an input signal is designed at both inputs. A sinus signal is preferably designed at both inputs of the energy meter device in the calibration mode.

The zero points of both digitized signals can for instance be advantageously compared with the phase evaluation block. Alternatively, it is also possible to evaluate the respective phase layers of the signal peak values of the digitized signals, English: peak.

Consequently, it is possible to determine the relative temporal distance of the zero points from one another. The calculation of the phase difference from the temporal distance of the zero points of both signals can for instance be advantageously effected by a logic unit in the phase evaluation block. Subsequently, it is possible to carry out a correction of exactly this phase difference in one of both channels by means of the established phase difference.

The phase correction value can be advantageously stored in the phase evaluation block so that the correction value is also available in normal operation according to the calibration mode.

As a result of the fact that no external components are required for the phase correction, the proposed energy meter device can be advantageously implemented at a very favorable cost. Hence, the proposed integratable energy meter device is particularly suited for mass manufacturing.

An additional advantage is provided by the fact that the time, which is needed to calibrate the energy meter device according to the proposed principle, is particularly limited. As a matter of principle, the phase difference between both input channels can be determined simply within one cycle duration of the input signal and preferably of the test signal. The cycle duration can thereby be simply calculated on the basis of the reciprocal value of the respective signal frequency. The signal frequency for energy meters is usually equal to 50 hertz or 60 hertz according to national standardization.

According to the proposed principle, a phase deviation is recorded between the input signals of the energy meter device that are already present as digital signals. The phase error is also corrected in the area of digital signal processing.

In order to quickly establish the phase deviation between the input channels of the energy meter device, it is advantageous to connect the clock input of the phase evaluation block with the clock inputs of the analog/digital transformers and thus to use the clock signal of the analog/digital transformers for the purpose of the phase evaluation, which is already used to operate the energy meter device.

The phase evaluation block is advantageously comprised of means for the permanent storage of a phase correction value. The means for the permanent storage of a phase correction value is preferably developed as a non-transient storage, for example as EEPROM.

Thanks to the permanent storage of the phase correction value, the latter, which is established in a calibration mode, is still available after switching the energy meter device on and off.

The analog/digital transformers are advantageously designed as sigma-delta transformers or as sigma-delta modulators, respectively. Consequently, it is possible to scan the input signals, which are derived from voltage and current, with high resolution in case of good integrability.

An integrator, which integrates the signal that was supplied by the multiplier, is advantageously provided at the output of the multiplier. The integrator can be advantageously designed as accumulator.

The integrator is advantageously designed in such a manner that it integrates the signal provided by the multiplier, which represents the current electrical power, to a signal that constitutes a measure for the consumed or produced electrical energy.

In a further preferable manner, the initial and second analog/digital transformer, the phase correction block and the phase evaluation block are designed in integrated circuitry.

The sigma-delta transformers, as well as additional function blocks and/or components in the signal processing chain of the energy meter device can also, as far as it is available, be advantageously designed in integrated circuitry. The energy meter device can be advantageously implemented in a single integrated semi-conductor circuit.

An output of a transmitter, which effects a galvanic isolation, can be advantageously attached to an initial input of the energy meter device and/or at the second input of the energy meter device.

The proportionally large phase deviations of such interstage networks, which effect a galvanic isolation of the inputs, can be compensated with the proposed principle in particularly simple and effective, as well as high-precision manner.

A means for the generation of a test signal is preferably provided. This signal is coupled with the first and second input of the energy meter device.

As far as switch-in interstage networks are provided for, such as transformer-like transmitters for example, the means to generate the test signal is advantageously designed in such a way that the test signal is fed at the input of the transmitter and switch-in interstage networks, respectively. It can thereby be advantageous to provide for a switchability of the inputs between a wanted signal mode and a calibration mode in which the inputs are connected with the means to generate the test signal.

It is preferable to downstream the analog/digital transformers per digital filter. The digital filters advantageously have each a control input to control the scanning rate of the digitized signal. A respective change of the scanning rate can be advantageously implemented particularly between the normal mode and the calibration mode.

The phase correction block can advantageously comprise of one of the digital filters.

The means to generate the test signal can be advantageously activated in a calibration mode while it can be deactivated in the normal mode, i.e. in the actual energy measuring operation.

As far as the method is concerned, the task is solved by a method to calibrate an energy meter device with the following steps:

switching in a test signal at two inputs of an energy meter device, digitizing the test signal that rests against both inputs, establishing a phase deviation between both digitized test signals, Generating a phase correction signal and charging of one of both digitized test signals with the phase correction signal.

The establishment of the phase deviation can for instance take place by comparing the phase layers of the signal zero points of both signals.

Alternatively, the phase deviation can be established by comparing the phase layers of the signal peak values with one another.

The phase layer is thereby determined and the phase deviation is established entirely in digital signal processing.

Other methods can also be applied to establish a phase deviation between two digitized signals, which can be implemented in digital signal processing technology.

The phase deviation can be established in a particularly precise manner by the fact that the scanning rate of the digitized signals are influenced in the calibration mode.

The sigma-delta excess scanning rate can for instance be reduced in the calibration mode since there is less dynamic at hand. A larger number of scanning values exists in a 50 hertz pulse elementary period so that the precision of establishing the phase deviation is increased.

A digital filtering with an adjustable decimation rate is advantageously provided for following the digitization process.

Altogether, the proposed principle offers the advantage of a clear cost reduction since no external components are necessary for the phase correction. In addition, the calibration can be implemented in a particularly short period of time, actually within a 50 or 60 hertz pulse elementary period.

Further details and advantageous executions of the proposed principle are object of the sub-claims.

DETAILED DESCRIPTION

Figure 1:
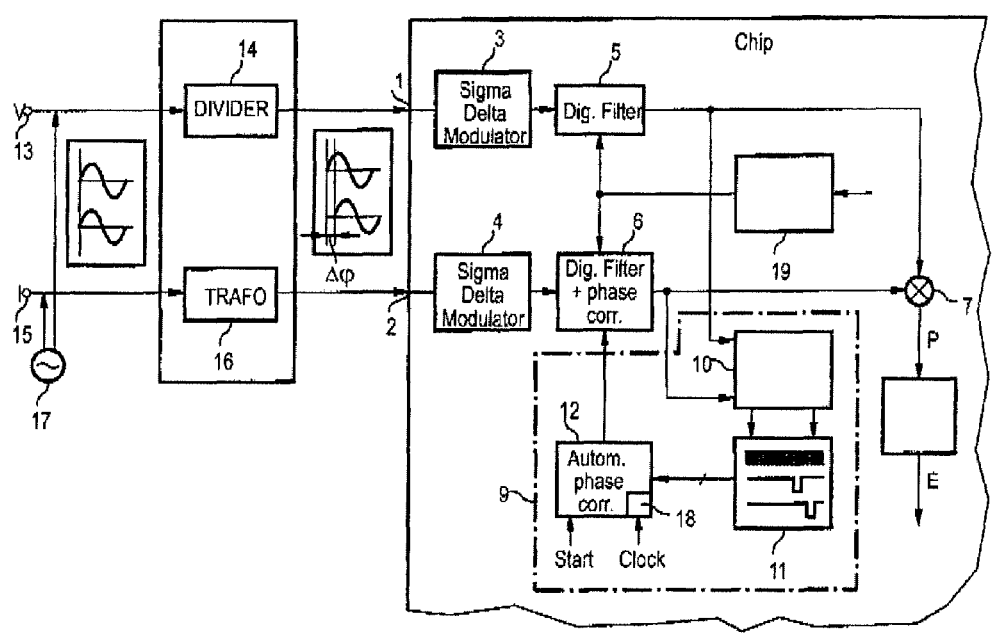
FIG. 1 is a block diagram of an example of the proposed energy meter device.

The FIGURE shows an energy meter device comprising an initial input 1 and a second input 2. Initial input 1 is designed to feed one of the signals that is derived from an electrical voltage v. Second input 2 is designed to feed one of the signals that is derived from an electrical current I. Electrical voltage V and electrical current I refer thereby to the same signal. The input of an initial analog/digital transformer 3 is connected to initial input 1. The input of a second analog/digital transformer 4 is connected to second input 2. The analog/digital transformers 3, 4 are each constructed as a sigma-delta modulator. The output of the first analog/digital transformer 3 is connected with the input of a multiplier 7 via an initial digital filter 5. The output of the second analog/digital transformer 4 is connected to an additional input of multiplier 7 via a second digital filter. The second digital filter comprises a phase correction block 6 that is equipped with a control input. An integrator 8 is attached to the output of multiplier 7. This integrator converts a signal positioned at its input, which constitutes a measure for the current electrical power P, into a signal that represents the electrical energy E. Furthermore, a phase evaluation block 9 is provided.

Phase evaluation block 9 features a phase layer detector 10 to determine the respective phase layers of the signal peak values. Phase layer detector 10 has two inputs that are connected to the outputs of digital filter 5 and of phase correction block 6. Two outputs of phase layer detector 10 are connected with two inputs of a phase difference detector 11, which is used for the determination of the phase deviation. The phase difference detector has an output that is multiple bits wider. The output of phase difference detector 11 is connected with the input of a control block 12, which, in turn, is connected with the control input of the same to trigger phase correction block 6.

Control block 12 consists of a non-transient storage device 18 in which the measured phase deviation or the relevant correction value can be permanently stored.

A scanning rate control 19 has two outputs that are connected with respective control inputs of phase correction block 6 with digital filter and the second digital filter 5. As a result, the scanning rate of the second digital filter 5 and of phase correction block 6 can be determined with a digital filter. The setting of the scanning rate depends on the respective mode.

The energy meter device described thus far is placed on a single chip in integrated circuitry.

A voltage divider 14, the output of which is connected with initial input 1 and the input of which constitutes a voltage input 13 to feed the electrical voltage, is provided to switch out the electrical voltage. A transformer 16, which is applied between a current input 15 and the second input 2 of the energy meter device, is provided to switch out the electrical current. Transformer 16 supplies a galvanic decoupling between current input 15 and the second input 2.

The output of a test signal generator 17 is attached to voltage input 13 and current input 15. Test signal generator 17 supplies a harmonic, available, sinus-shaped signal with a rate frequency of 50 or 60 hertz depending on the state's specifications.

Differing phase shifts arise for both input channels of the energy meter via voltage divider 14 and transformer 16. The relative phase difference ΔΦ between both input channels at the inputs 1, 2 of the energy meter device is of particular importance. This phase deviation ΔΦ is established by means of phase evaluation block 9.

The phase deviation ΔΦ is established in a calibration mode in such a manner that test signal generator 17 is activated and a phase-similar, sinus-shaped signal is thus fed in at voltage input 13 and current input 15. This signal experiences a different phase shift in voltage divider 14 and transformer 16.

The relative phase shift ΔΦ at the inputs 1,2 is established in phase evaluation block 9 in detectors 10,11 by the fact that the timeframe between the zero points or peak values of both signals is recorded at the inputs of phase evaluation block 9 and are converted to a corresponding phase deviation. A corresponding correction value is supplied by control block 12 and emitted at the output of phase evaluation block 9. For this reason, a phase correction block 6 is triggered in the digital filter, which immediately balances the phase difference ΔΦ.

The excess scanning rate of the sigma-delta modulators is proportionally high since the current in the normal mode must be recorded exactly via a large dynamic area. Consequently, a suitable signal-noise relationship can be achieved.

The requirement of a large dynamic area is not valid in the calibration mode in which a harmonic test signal is fed in. Peaks or zero points of the digitized test signal must rather be recorded in both channels and compared in order to be able to establish a phase deviation.

The excess scanning rate of the modulators can be reduced based on the fact that a smaller dynamic area is required in the calibration mode. As a result, more scanning values are available within a pulse elementary period. The precision of the recognition of the phase deviation is determined by the frequency of the scanning cycle.

559 scanning values are produced in a pulse elementary period of the test signal in the case of a 50 Hz test signal, an excess scanning rate of 16 and a scanning frequency of 28 kHz. A scanning value corresponds thereby with 0.64 degrees, namely the quotient of 360 and 559. The measured electrical power of 0.00054 dB would be under the optimum in the case of a phase shift of 0.64 degrees between the voltage and current channel. This corresponds to a relative error of 0.00624%, which is negligible, for a power factor equal to 1. The precision of the phase correction can be further increased by the corresponding choice of scanning values.

The power factor, English: power factor is defined in accordance with the usual convention in such a way that the current and voltage are equal in phases in case of a power factor of 1, in other words, there is a phase shift of 0 degrees between voltage and current. The power factor is thus equal to 0.5 in case of a phase deviation between current and voltage of for example 60 degrees. Consequently, this corresponds to the cosine of the phase difference.

The relative error is calculated according to the rule $$\frac{(1-\cos(0°-0.64°))}{\cos 0°} \cdot 100 = 0.00624\%$$

in case of a power factor equal to 1 and a phase shift of 0.64 degrees.

The calibration mode is activated once when manufacturing the energy meter device.

An automatic phase correction is supplied for integrated energy meter devices by means of the proposed principle, which is entirely integrated and completely realized in digital signal processing.

In addition, the proposed energy meter device distinguishes itself by a limited calibration time, as well as low manufacturing costs. Furthermore, it is possible to galvanically isolate at least one channel at the input of the energy meter device without any measurement errors occurring. The galvanic isolation is of particular importance when more than one channel is measured, as is common for electrical energy meters.

A phase shift in particular, which is unavoidably caused by transformers, can be compensated. No additional external components, such as resistance capacity networks, are thereby required for phase correction.

Due to the non-transient storage 18, the phase correction value is still available when the energy meter is switched off.

A particularly quick calibration can be carried out with the proposed principle since the determination of the phase deviation is essentially possible within one cycle duration.

Phase evaluation block 9 advantageously has a clock input, which is connected to the clock inputs of the sigma-delta modulators 3,4. Consequently, the clock flanks between two zero points can be counted and the phase deviation can be established in a simple and precise manner.

According to the proposed principle, the relative phase deviation at both outputs of the analog/digital transformers is recorded in the field of digital signals. The correction of the phase deviation also takes place in the field of digital signal processing.

The invention claimed is:

1. An energy meter comprising:
   a first analog/digital transformer comprising an input configured to receive a signal derived from a voltage and to provide an output,
   a second analog/digital transformer comprising an input configured to receive a signal derived from a current and to provide an output,
   a phase evaluation block comprising first and second inputs and an output, wherein the first input of the phase evaluation block is electrically connected to the output of the first analog/digital transformer and the second input of the phase evaluation block is connected to the output of the second analog/digital transformer; and
   a phase correction block comprising a control input electrically connected to the output of the phase evaluation block, wherein the phase correction block is connected to an output of at least one of the first and second analog/digital transformers and the phase correction block is configured to correct a phase deviation of a digitized signal that is derived from at least one of the current and the voltage.

2. The energy meter of claim 1, wherein the phase evaluation block comprises a control block configured to trigger the phase correction block based on the phase deviation.

3. The energy meter of claim 2, wherein the control block comprises a storage device configured to store a phase correction value.

4. The energy meter of claim 2, wherein the phase evaluation block comprises a phase difference detector, the phase difference detector comprising:
   a first input electrically connected to the output of the first analog/digital transformer;
   a second input electrically connected to the output of the second analog/digital transformer; and
   an output electrically connected to the control block.

5. The energy meter of claim 4, wherein the phase evaluation block further comprises a phase layer detector between the outputs of the first and second analog/digital transformers and the first and second inputs of the phase difference detector.

6. The energy meter of claim 5, wherein the phase layer detector is configured to determine signal peak values of the digitized signal.

7. The energy meter of claim 5, wherein the phase layer detector is configured to determine signal zero points of the digitized signal.

8. The energy meter of claim 1, wherein the first and second analog/digital transformers comprise sigma-delta transformers.

9. The energy meter of claim 1, wherein the first and second analog/digital transformers, the phase correction block, and the phase evaluation block comprise integrated circuits.

10. The energy meter of claim 1, further comprising a non-galvanic coupling transmitter electrically connected to at least one of the first input of the first analog/digital transformer and the input of the second analog/digital transformer, wherein the non-galvanic coupling transmitter is configured to switch on the received signal.

11. The energy meter of claim 10, wherein the non-galvanic coupling transmitter comprises a transformer.

12. The energy meter of claim 1, further comprising a test signal generator electrically connected to the inputs of the first and second analog/digital transformers, wherein the test signal generator is configured to provide a test signal in a calibration mode.

13. The energy meter of claim 1, further comprising a multiplier electrically connected to the outputs of the first and second analog/digital transformers.

14. The energy meter of claim 13, further comprising an integrator electrically connected to the multiplier.

15. The energy meter of claim 13, wherein the phase correction block comprises a first digital filter, and the energy meter device further comprises a second digital filter between the output of the first analog/digital transformer and the multiplier.

16. The energy meter of claim 15, further comprising a sampling rate control device electrically connected to the control input of the phase correction block and the input of the second digital filter.

17. A method for calibrating an energy meter, comprising:
   coupling a test signal to first and second inputs of the energy meter;
   digitizing the test signal coupled to the first input to generate a first digitized test signal;
   digitizing the test signal coupled to the second input to generate a second digitized test signal;
   determining a phase deviation between the first and second digitized test signals,
   generating a phase correction signal; and
   applying the phase correction signal to one or more of the first and second digitized test signals.

18. The method of claim 17, wherein determining the phase deviation comprises measuring signal peak values of the first and second digitized test signals to establish the phase deviation.

19. The method of claim 17, wherein determining the phase deviation comprises measuring signal zero points of the first and second digitized test signals to establish the phase deviation.

20. The method of claim 17, further comprising digitally filtering the first and second digitized test signals prior to determining the phase deviation.

21. The method of claim 20, further comprising setting a sampling rate of the filtering of the first and second digitized test signals.

22. The method of claim 17, wherein coupling the test signal to the first and second inputs comprises inductively coupling the test signal to at least one of the first and second inputs of the energy meter device.

* * * * *